United States Patent [19]

Steininger

[11] Patent Number: 4,703,028

[45] Date of Patent: Oct. 27, 1987

[54] CARRIER FOR THE MANUFACTURE OF ABRASION-RESISTANT CATALYSTS, PROCESS FOR THE PRODUCTION OF THE CARRIER AND CATALYST DEPOSITED ON THE CARRIER

[75] Inventor: Helmut Steininger, Neu-Anspach, Fed. Rep. of Germany

[73] Assignee: Battelle - Institut e.V., Frankfurt, Fed. Rep. of Germany

[21] Appl. No.: 763,436

[22] PCT Filed: Dec. 8, 1984

[86] PCT No.: PCT/EP84/00394

§ 371 Date: Aug. 6, 1985

§ 102(e) Date: Aug. 6, 1985

[87] PCT Pub. No.: WO85/02557

PCT Pub. Date: Jun. 20, 1985

[30] Foreign Application Priority Data

Dec. 8, 1985 [DE] Fed. Rep. of Germany ....... 3344343

[51] Int. Cl.$^4$ .................. B01J 21/02; B01J 21/04; B01J 21/06
[52] U.S. Cl. .................................... 502/178; 502/177; 502/200; 502/202; 502/240; 502/355; 502/439
[58] Field of Search ............... 502/439, 177, 178, 200, 502/202, 240, 355

[56] References Cited

U.S. PATENT DOCUMENTS 3,966,645 6/1976 Cairns et al. ................... 502/527 X
4,297,247 10/1981 Krabetz et al. ..................... 502/310
4,536,482 8/1985 Carcia et al. ................... 502/439 X

FOREIGN PATENT DOCUMENTS 1717152 1/1972 Fed. Rep. of Germany .
859058 12/1940 France .

OTHER PUBLICATIONS

Above References Land M, were Cited in the International Search Report.

Primary Examiner—W. J. Shine
Attorney, Agent, or Firm—Birch, Stewart, Kolasch & Birch

[57] ABSTRACT

A carrier for abrasion-resistant catalysts having a surface coated with high-fusion oxides, nitrides and/or carbides of at least one transition metal, or boron, of aluminum and/or of silicon or of combination of these compounds. The coating is carried out using physical vapor deposition techniques, such as evaporating coating ion plating or cathode sputtering. The layer thus produced consists of individual structures, such as stems and/or columns having different elevations which together produce a porous layer serving as an intermediate layer for the subsequent deposition of the catalytic material.

15 Claims, No Drawings

CARRIER FOR THE MANUFACTURE OF ABRASION-RESISTANT CATALYSTS, PROCESS FOR THE PRODUCTION OF THE CARRIER AND CATALYST DEPOSITED ON THE CARRIER

The present invention concerns itself with a carrier for the manufacture of abrasion-resistant catalysts, a manufacturing method for this carrier as well as its application in the manufacture of shell catalysts.

Shell catalysts are used for catalytic reactions and, in particular, for use in oxidizing reactions of hydrocarbons, cracking reactions of low octane paraffin cuts to flammable gases of high octane number and hydrocracking reactions. These catalysts consist of carriers, for example in the shape of spheres, tablets or other moulded elements, the surface of which has a dish-shaped catalytically active layer. The application of the catalytically active layer onto the carrier is effected using wet chemical methods. A process is described, for example, in the DE-OS No. 31 25 062 in which a suspension of the base material for the shell is sprayed onto an agitated bed, dried and tempered. According to the methods suggested in the DE-OS No. 28 14 262 and DE-OS No. 29 09 671, the pre-moistened carrier particles are sprayed with a catalytically active material and suspended in water. All these methods have the disadvantage of unsatisfactory adhesive strength of the dish, and the surface structure and layer thickness cannot be freely determined.

The task underlying the present invention is to produce a catalyst carrier with defined surface structure, pore distribution and surface characteristics which can be reproduced in a manufacturing process, and which allows for an abrasion-resistant arrangement of the catalytic layer.

The invention solves this task by providing the surface of an inert carrier with a layer, applied by a physical coating method, which is made up of individual structures producing porosity which in their turn consist essentially of high-fusion oxides, nitrides and/or carbides of at least one transition element, of boron, aluminum and/or of silicon or of combinations of these compounds.

Metallic or non-metallic, low-porous and also compact inert materials are used for the carrier e.g. silicic acid compounds such as silicates, in particular magnesium silicate, calcium aluminum silicate, clays, zeolites and similar, kaolin, aluminum silicate, aluminum oxide and hydroxide, silicon dioxide, furthermore titanium dioxide, zirconium dioxide and similar. There is a wide selection with regard to shape and size of the carrier e.g. tabletted, grained and lumpy carriers, pellets or spheres can be used.

It was ascertained that layers which are suitable for use with these usual types of carrier material consist of oxides, nitrides and/or carbides of transition elements, preferably of elements of the IV to VI auxiliary groups of the periodic systems, in particular of titanium, vanadium, chromium, zircon, molybdenum or tungsten. Oxides, nitrides or carbides of boron, aluminum or silicon are also suitable. Combinations of such compounds can also be used, e.g. carbonitrides. The type and/or composition of the catalytically active material is not specific for the invented carrier. Basically, any catalytically active material can be used. The invention also forsees the possibility of the catalytically active layer corresponding to the carrier coating.

The porosity of the carrier coating is preferably in the micrometer range and is responsible for the good adhesion of the catalytically active mass. According to the present invention, porosity of the layer is to be understood as a non-coherent structure with continuous spaces between those parts coated with the layer up to the carrier surface region. In other words, the layer consists of several individual elevations whose diameter and height lie in the micrometer range. Similarly, the diameters of the spaces between the individual elevations lie within the micrometer range. These elevations are preferably stem-shaped or columnar having a height ranging from 0.5 to 20 $\mu$m, preferably from 1 to 10 $\mu$m. The layers produced in this way are hard and also abrasion-resistant due to suitable texturing and frequently contain other elements such as metals in low concentration.

The invention forsees that the base carrier is coated, using physical coating methods in a batch or continuous operation, and in vacuum coating units. Physical methods to apply layers of a few micrometers thickness, so-called PVD processes, are known, e.g. cathode sputtering, or evaporation coating along with its variations and combinations, such as ion plating. Apart from the homogenous closed layers, these methods also allow porous layers to precipitate. The latter has been given little attention up to now. It was, however, suprisingly ascertained within the scope of the invention that defined porous layers which have been manufactured using physical coating methods are very well suited as adhesion-promoting layers for catalysts, and in particular, for shell catalysts. The invention forsees the introduction of the carrier or carrier particles into the coating unit which are then heated to a temperature, set beforehand, in order to influence porosity among other things. Here, the carrier temperature may only amount to a maximum of about 0.3 to 0.35 or 0.4 times the melting point of the material of the porous layer. Finally, the process gas is introduced into the evacuated coating chamber of the unit. The process gas consists of an inert gas, preferably argon, and/or of reactive gases e.g. nitrogen and/or hydrocarbons, oxygens. The partial pressures of the gases introduced similarly influence porosity. It is generally true to say that the degree of porosity increases with increasing gas pressure and decreasing carrier temperature. In addition, the degree of porosity can be influenced by the application of a bias voltage: the porosity is generally decreased with increasing bias voltage. The degree of porosity can be similarly adjusted by variations of the rate of precipitation.

The chemical composition of the base material to be precipitated and the type and concentration of the reactive gases introduced determine the stoichiometry of the invented carrier. Variations in the carrier layer composition e.g. by the alloying of elements, can influence the catalytic reaction. According to the above explanations this can be effected, on the one hand, by the introduction of other gaseous components e.g. metallo-organic compounds, hydrocarbons and the like, or by using a base material of appropriate composition. With appropriate parameter selection, which is easy to ascertain in each case, the layer is precipitated in a stem-shaped or columnar structure.

The catalytically active material is precipitated on coated carriers with defined columnar structure.

The catalytically active layer can be similarly produced by physical coating methods such as evaporation coating, ion plating or cathode sputtering and also by a cold plasma-supported CVD method. The application of the catalytic layer can also be effected, however, with the aid of known methods, such as used in the coating of zeolithic catalysts e.g. wet chemical method, or through the decomposition of organo-metallic compounds in a conventional CVD process.

There are various possibilities according to the required thickness of the catalytic layer. The stems or columns of the carrier layer can, for example, be coated very thinly with the catalytically active material without the carrier layer losing its structure. The spaces between the individual elevations or columns of the layer can also be filled up completely with the catalyst material. Furthermore, the whole layer structure can be covered so that the columnar layer acts as an adhesion-promotive interlocking system.

The invention will be explained in more detail with the aid of the following example:

Spheres of compact aluminum-oxide with a diameter of approx. 5 to 10 mm are used as carriers. The carriers are heated to a temperature of approx. 180° C. The coating is effected in a conventional vacuum coating unit by cathode sputtering of a titanium-carbide target. A mixture of argon and acetylene is used as process gas. The prevailing argon pressure lies at approx. 2 to $30.10^{-3}$ mbars under process conditions; the pressure of the added acetylene reactive gas is approx. $8.10^{-5}$ to $1.10^{-3}$ mbar. The thickness of the precipitated layer is 1 to 10 $\mu$m, the porosity approx. 1 $\mu$m. Higher carrier temperatures are required for middle layers with lower porosity.

The activation of the middle layer i.e. the precipitation of a catalytically active mass is similarly effected by cathode sputtering in the same unit. To this end, a reactive atomisation takes place with a vanadium or vanadium-pentoxide target in a gaseous atmosphere consisting of argon and oxygen. The layer thickness here is a maximum of 1 $\mu$m. Given appropriate parameter selection, the catalytic layer is not porous.

I claim:

1. An abrasion-resistant catalyst comprising an inert carrier provided with a surface coating of a high fusion oxide, nitride and/or carbide of at least one transition metal, boron, aluminum and/or silicon or combinations of these compounds, said surface coating being deposited by means of physical vapor deposition techniques and serving as an intermediate coating for the subsequent deposition of a catalytic material, said intermediate coating being composed of a plurality of individual elevated structures having a height of from 0.5 to 20 $\mu$m, said structures defining spaces disposed therebetween, and said spaces being completely filled with a catalytic material and structures being covered with said catalytic material whereby said structures act as adhesive-promoting, interlocking members of said catalytic material, and wherein prior to said surface coating being deposited, the inert carrier had been heated to a temperature of approximately 0.3 to 0.4 times the melting point of the surface coating.

2. The abrasion-resistant catalyst of claim 1 wherein the porosity of the intermediate coating is within the micrometer range.

3. The abrasion-resistant catalyst of claim 1 wherein the height of the elevated structures of the intermediate coating is 1 to 10 $\mu$m.

4. The abrasion-resistant catalyst of claim 1 wherein the intermediate coating comprises oxides, nitrides and/or carbides of transition metals of groups IV to VI of the periodic table.

5. The abrasion-resistant catalyst of claim 4 wherein the intermediate coating is an oxide, nitride and/or carbide of at least one member selected from the group consisting of titanium, vanadium, chromium, zirconium, molybdenum and tungsten.

6. The abrasion-resistant catalyst of claim 1 wherein the elevated structures of the intermediate coating are provided with a thin coating of the catalytically active material without the intermediate coating losing its structural configuration.

7. The abrasion-resistant catalyst of claim 1 wherein the elevated structures are stems and/or columns.

8. A process for the production of an abrasion-resistant catalyst carrier comprising heating an inert carrier, coating the surface of the inert carrier by means of physical vapor deposition techniques in the presence of an inert gas and/or a reactive gas with a high-fusion oxide, nitride and/or carbide of at least one transition metal selected from the group consisting of boron, aluminum and silicon or combinations of these compounds, under condition to obtain a coating composed of a plurality of individual structures having a height of from 0.5 to 20 $\mu$m and a given porosity, said coating serving as an intermediate coating for the subsequent deposition of the catalytic material, wherein the heating is conducted at a temperature of approximately 0.3 to 0.4 times the melting point of the surface coating.

9. The process of claim 8 wherein the intermediate coating is produced by evaporation coating, ion plating or cathode sputtering.

10. The process of claim 8 wherein the stoichiometry of the intermediate coating is determined by variations of the composition of the base material to be and by the type and concentration of reactive gases in the process gas.

11. The process of claim 8 wherein the porosity of the intermediate coating is modified by variation of the relation of partial pressures of the process gas components, by application of bias voltage, by adjustment of the temperature of the inert carrier to be coated and/or by the deposition rate.

12. The process of claim 8 wherein the catalytic material is deposited onto the intermediate coating by means of physical vapor deposition techniques or by using a cold plasma-assisted CVD process.

13. The process of claim 8 wherein the catalytic material corresponds in composition to the material of the intermediate coating.

14. The process of claim 8 wherein the individual structures of different elevations are stems and/or columns.

15. The process of claim 12 wherein the physical vapor deposition techniques are evaporation coating, ion plating or cathode sputtering.

* * * * *